(12) United States Patent
Kim et al.

(10) Patent No.: US 11,903,251 B2
(45) Date of Patent: Feb. 13, 2024

(54) DISPLAY DEVICE HAVING TOUCH SENSOR

(71) Applicant: LG DISPLAY CO., LTD., Seoul (KR)

(72) Inventors: Tae-Ryong Kim, Paju-si (KR); Ye-In Hong, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 452 days.

(21) Appl. No.: 17/123,686

(22) Filed: Dec. 16, 2020

(65) Prior Publication Data

US 2021/0202637 A1    Jul. 1, 2021

(30) Foreign Application Priority Data

Dec. 31, 2019  (KR) .................. 10-2019-0179635

(51) Int. Cl.
*H10K 59/121* (2023.01)
*H10K 50/844* (2023.01)
*H10K 50/842* (2023.01)
*H10K 59/40* (2023.01)
*H10K 59/122* (2023.01)
*H10K 59/124* (2023.01)

(52) U.S. Cl.
CPC ....... *H10K 59/1213* (2023.02); *H10K 50/844* (2023.02); *H10K 50/8426* (2023.02); *H10K 59/122* (2023.02); *H10K 59/124* (2023.02); *H10K 59/40* (2023.02)

(58) Field of Classification Search
CPC .. H10K 59/1213; H10K 59/40; H10K 59/122; H10K 59/124; H10K 50/844; H10K 50/8426
USPC .......................................... 257/40
See application file for complete search history.

(56) References Cited

U.S. PATENT DOCUMENTS

2004/0209405 A1    10/2004  Kwak et al.
2018/0190723 A1*   7/2018   Han ................... G06F 3/0412

FOREIGN PATENT DOCUMENTS

KR    10-19980005467 A    3/1998
KR    10-20010057024 A    7/2001

* cited by examiner

*Primary Examiner* — Xia L Cross
(74) *Attorney, Agent, or Firm* — Morgan, Lewis & Bockius LLP

(57) ABSTRACT

A display device has a touch sensor. The display device includes a first substrate including a plurality of sub-pixels, a thin film transistor in each sub-pixel of the first substrate, an organic light emitting element in each sub-pixel of the first substrate, an insulating layer over the thin film transistor and the organic light emitting layer, a touch sensor over the insulating layer, a passivation layer covering the touch sensor, and a second substrate disposed over the passivation layer, wherein a plurality of concave portions are formed in the insulating layer and the concave portions are filled with the passivation layer to form adhesive reinforcing portion.

20 Claims, 13 Drawing Sheets

DISPLAY DEVICE HAVING TOUCH SENSOR

CROSS-REFERENCE TO RELATED APPLICATION

This application claims priority to and the benefit of Korean Patent Application No. 10-2019-0179635, filed on Dec. 31, 2019, the disclosure of which is incorporated herein by reference in its entirety.

BACKGROUND

1. Technical Field

This present disclosure relates to a display device, more particular, to a display device having a touch sensor on an encapsulation layer.

2. Discussion of the Related Art

In recent years, as society enters the era of full-fledged information, touch sensor that can easily input information into electronic devices have been introduced. This touch sensor is widely used not only in portable display devices such as smart phones and tablet PCs, but also large display devices such as public facilities display devices and smart TVs.

However, when the touch sensor is included in the display device, there is a problem in that the thickness or size of the display device increases as the number of wirings and connection points that transmit touch driving and/or sensing signals increases.

SUMMARY

Accordingly, embodiments of the present disclosure are directed to a display device having a touch sensor that substantially obviates one or more of the problems due to limitations and disadvantages of the related art.

An aspect of the present disclosure is to provide a display device in which a touch sensor is disposed on an encapsulation layer to prevent the increase of the thickness and the size of the display device.

Other aspect of the present disclosure is to provide a display device in which contact area of second passivation layer of the touch sensor is increased to increase the adhesion force of the second passivation layer so as to prevent separation of the second passivation layer from the display device.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings To achieve these and other aspects of the inventive concepts, a display device comprises a first substrate including a plurality of sub-pixels, a thin film transistor in each sub-pixel of the first substrate, an organic light emitting element in each sub-pixel of the first substrate, an insulating layer over the thin film transistor and the organic light emitting element, a touch sensor over the insulating layer, a passivation layer covering the touch sensor, and a second substrate disposed over the passivation layer, wherein a plurality of concave portions are formed in the insulating layer and the concave portion is filled with the passivation layer to form an adhesive reinforcing portion.

The concave portion may be formed in the interlayer and the buffer layer to expose the organic encapsulation layer and the adhesive reinforcing portion may be formed inside of the concave portion so that the adhesive reinforcing portion may be contacted with the exposed surface of the organic encapsulation layer. Further, the concave portion may penetrates the interlayer and the buffer layer and may be formed in a part of the organic encapsulation layer, and the adhesive reinforcing portion may be formed inside of the concave portion so that the adhesive reinforcing portion may be contacted with inside of the organic encapsulation layer.

The concave portion may be formed in the interlayer, the buffer layer, the organic encapsulation layer, and the inorganic encapsulation layer to expose a part of the surface of the bank layer, and the adhesive reinforcing portion may be formed inside of the concave portion so that the adhesive reinforcing portion may be contacted with the exposed surface of the bank layer. Further, the concave portion may be formed in the interlayer, the buffer layer, the organic encapsulation layer, and the inorganic encapsulation layer and may be formed in a part of the bank layer, the adhesive reinforcing portion may be formed in the concave portion so that the adhesive reinforcing portion may be contacted with inside of the bank layer.

The inorganic encapsulation layer and the organic encapsulation layer may be formed in an outer portion of the first substrate to encapsulate the structure thereof, and the inorganic encapsulation layer may be disposed on the first substrate outside of the organic encapsulation layer, and the concave portion may be formed in the inorganic encapsulation layer on the first substrate and the passivation layer may be extended to the outer portion of the first substrate so that the adhesive reinforcing portion may be formed inside the concave portion.

The concave portion may be formed in the substrate at the outer portion of the first substrate and the passivation layer may be extended to the outer portion of the first substrate so that the adhesive reinforcing portion may be formed inside of the concave portion.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain various principles.

DETAILED DESCRIPTION

Figure 1:
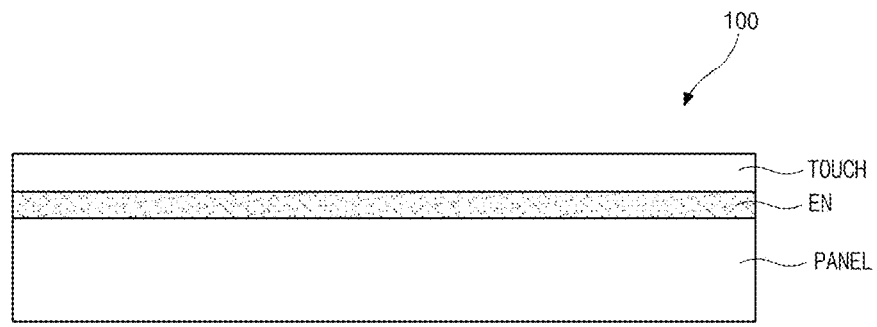
FIG. 1 is a schematic view of a display device according to the present disclosure.

Advantages and technical features of the present disclosure, and methods for achieving the advantages and the technical features will be clarified with reference to embodiments described below in detail together with the accompanying drawings. However, the present disclosure is not limited to the embodiments disclosed below, but will be implemented in various different forms. The embodiments allow the disclosure of the present disclosure to be complete and the ordinary skilled in the art to fully understand. The present disclosure is only defined by the scope of the claims.

The shapes, sizes, ratios, angles, numbers, etc., disclosed in the drawings for describing the embodiments of the present present disclosure are exemplary, and the present present disclosure is not limited to the drawings. The same reference numerals refer to the same components throughout the specification. In addition, in the description of the present disclosure, when it is determined that detailed descriptions of related known technologies may unnecessarily obscure the subject matter of the present disclosure, detailed descriptions thereof will be omitted. When 'include', 'have', 'consist of', etc., are used in this specification, other parts may be added unless 'only' is used. When a component is expressed as a singular number, the plural number is included unless otherwise specified.

In interpreting the components, it is interpreted as including the error range even if there is no explicit description.

In the case of the description of the positional relationship, for example, when the positional relationship of two parts is described as 'on', 'over', 'under', 'at a side', etc., one or more other parts may be positioned between the two parts unless 'right' or 'direct' is used.

In the case of the description of the temporal relationship, for example, when the temporal order relationship is described as 'after', 'continually', 'next', 'before', etc., discontinuous cases may be included unless 'right' or 'direct' is used.

Terms 'first', 'second', etc., are used to describe various components, but these components are not limited by these terms. These terms are only used to distinguish one component from another component. Accordingly, the first component mentioned below may be the second component within the technical spirit of the present disclosure.

In describing the components of the present disclosure, terms of 'first', 'second', 'A', 'B', '(a)', '(b)', etc. may be used. These terms are only used to distinguish the component from other components, and the nature, turn, order, or number of the component is not limited by the terms. When a component is described as being "connected", "combined" or "contacted" to another component, the component is directly connected or contacted to the another component, but it is to be understood that another component may be "interposed" between the components or the components may be "connected", "combined" or "contacted" through another component.

In the present disclosure, a "display apparatus" may include a narrow-sense display device including a display panel and a driving portion for driving the display panel such as a liquid crystal module (LCM), an organic light-emitting module (OLED module), and a quantum dot module (QD module). In addition, the display apparatus may include a complete product or final product including an LCM, an OLED module or a QD module such as a notebook computer, a television, a computer monitor, an equipment display including an automotive display apparatus or a different type of vehicle, a set electronic device such as a mobile electronic device apparatus of a smartphone or an electronic pad, or a set device or set apparatus.

Accordingly, the display apparatus of the present disclosure may include a narrow-sense display device itself such as an LCM, an OLED module or a QD module and an applied product or a set device that is a final consumer device including an LCM, an OLED module or a QD module.

Additionally, in some cases, an LCM, an OLED module or a QD module composed of a display panel and a driving portion may be expressed as a narrow-sense "display device", and an electronic device as a complete product including an LCM, an OLED module or a QD module may be separately expressed as "a set device." For example, the narrow-sense display device may include a display panel such as a LC panel, an OLED panel or a QD panel and a source PCB that is a control unit for driving the display panel, and the set device may be a concept that further includes a set PCB, which is a set control unit electrically connected to the source PCB to control the entire set device.

The display panel used in the embodiment of the present disclosure may include all types of display panels such as a liquid crystal display panel, an organic light-emitting diode display panel, a quantum dot display panel, or an electroluminescent display panel and is not limited to a specific display panel capable of bending a bezel with a flexible substrate for an OLED display panel of the present embodiment and a backplane support structure thereunder. In addition, the display panel used in the embodiment of the present disclosure is not limited to the shape or size of the display panel.

For example, when the display panel is an OLED display panel, it may include a plurality of gate lines and data lines and pixels formed at crossing areas of the gate lines and the data lines. In addition, it may be configured to include an array including a thin film transistor which is an element for selectively applying a voltage to each pixel, an organic light-emitting device (OLED) layer on the array, an encapsulation substrate or encapsulation layer over the array to cover the organic light-emitting device layer, and so on. The encapsulation layer may protect the thin film transistor and the organic light-emitting device layer from the external impacts and prevent moisture or oxygen from penetrating into the organic light-emitting device layer. Further, an inorganic light-emitting layer formed on the array may include a nano-sized material layer or a quantum dot, for example.

Hereinafter, the embodiments will be described in detail accompanying the drawings.

FIG. 1 is a schematic view of a display device 100 according to the present disclosure.

As shown in FIG. 1, the display device 100 includes a display panel PANEL, an encapsulation layer EN covering the display panel PANEL, and a touch sensor TOUCH over the encapsulation layer EN.

The display panel PANEL is an organic light emitting display panel. The encapsulation layer EN seals the organic light emitting display panel PANEL from the outside, so that foreign substances such as moisture or air are not permeated to the inside of the organic light emitting display panel PANEL to prevent defect of an organic light emitting layer of the organic light emitting display panel PANEL. Although described later, the encapsulation layer EN may be formed of a plurality of encapsulation layers including an inorganic encapsulation layer and an organic encapsulation layer.

In this way, the structure in which the touch sensor TOUCH is directly disposed on the encapsulation layer EN of the display device 100 is referred to as a TOE (touch sensor on thin film encapsulating) structure.

In this display device of the TOE structure, since the touch sensor TOUCH is directly formed on the encapsulation layer EN without a separate base film such as a substrate for the touch panel, the thickness of the display device 100 may be reduced. Further, since the expensive base film is not needed, the cost of the display device 100 may be reduced. In addition, since the bonding process of the touch panel and the display panel is not needed, the manufacturing process of the display device 100 may be simplified.

And, since the touch sensor TOUCH is directly disposed on the encapsulation layer EN having the thin inorganic encapsulation layer and the thin organic encapsulation layer, the flexible display device may be easily fabricated.

Hereinafter, the display device 100 having above structure will be described in detail.

Figure 2:
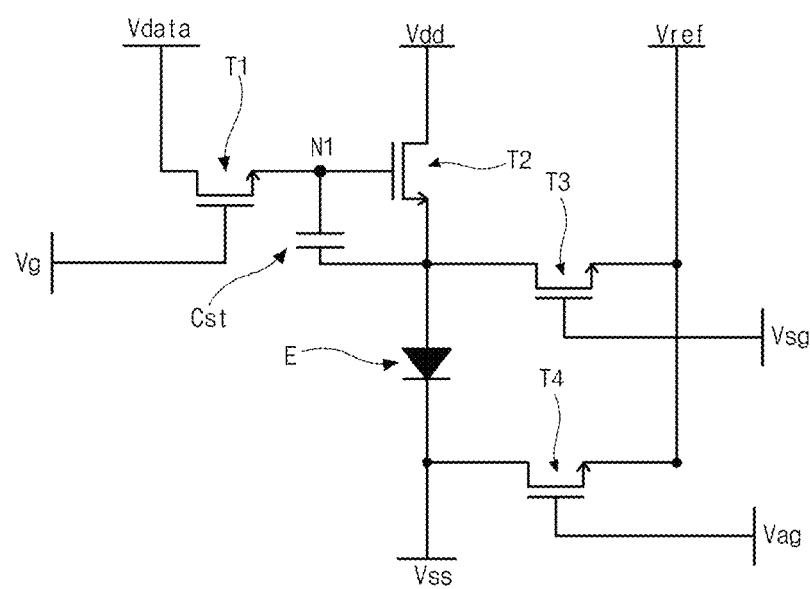
FIG. 2 is a circuit diagram of an organic light emitting display panel according to the present disclosure.

FIG. 2 is a circuit diagram of the organic light emitting display panel PANEL in the display device 100 according to the present disclosure.

The organic light emitting display panel PANEL includes a display area and a pad area. The display area has a plurality of sub-pixels SPX. Each sub-pixel SPX displays a single color in the organic light emitting display device. For example, each sub-pixel SPX displays any one of red, green, blue, and white. In this case, red, green, blue, and white sub-pixels SPX may be defined as one pixel. The plurality of sub-pixels SPX are arranged in a matrix shape in the substrate of the organic light emitting display device, and a plurality of electric lines may be disposed between the plurality of sub-pixels SPX in the display area.

Further, various electric lines electrically connected to electric lines arranged in the display area may be arranged in the pad area to apply signals to light emitting elements of the organic light emitting display device. These electric lines may include, for example, a Vdd line, a Vdata line, a reference line (Vref line), and a Vss line.

As shown in FIG. 2, each sub-pixel SPX of the organic light emitting display panel PANEL according to the present disclosure includes a switching TFT (thin film transistor) T1, a driving TFT T2, a storage capacitor Cst, and a sensing TFT T3, an auxiliary TFT T4, and a light emitting element E. Since the sub-pixel SPX of the organic light emitting display device according to the present disclosure includes 4 TFTs and 1 capacitor, it may be referred to as 4T1C structure.

However, the structure of the sub-pixel SPX of the organic light emitting display device according to the present disclosure is not limited to the 4T1C structure. The structure of the sub-pixel SPX of the organic light emitting display device according to the present disclosure may be formed in the various structures such as a 4T2C structure having 4 TFTs and 2 capacitors, a 5T2C structure having 5 TFTs and 2 capacitors, a 6T2C structure having 6 TFTs and 2 capacitors, and a 7T2C structure having 7 TFTs and 2 capacitors.

The 4 TFTs in the sub-pixel SPX each includes a semiconductor layer, a gate electrode, a source electrode, and a drain electrode, and may be a P type TFT or an N type TFT. FIG. 2 illustrates only N type TFT for convenience of description.

The switching TFT T1 includes the drain electrode connected to the data line, the source electrode connected to the first node N1, and the gate electrode connected to the gate line. The switching TFT T1 is turned on by the gate voltage Vg applied to the gate line from a gate drive unit to charge the data voltage Vdata, which is applied to the data line from a data drive unit, to the first node N1.

The driving TFT T2 includes the drain electrode connected to a high potential line (i.e., the Vdd line), the source electrode connected to an anode of the light emitting element E, and the gate electrode connected to the first node N1. The driving TFT T2 is turned on when the voltage of the first node N1 is higher than a threshold voltage (Vth), and is turned off when the voltage of the first node N1 is lower than the threshold voltage. The driving TFT T2 transfers the driving current received from the Vdd line to the light emitting device E.

The storage capacitor Cst includes an electrode connected to the first node N1 and electrode connected to the source electrode of the driving TFT T2. The storage capacitor Cst maintains a potential difference between the gate electrode and the source electrode of the driving TFT T2 during the emission time when the light emitting device E emits light, so that a certain driving current is applied to the light emitting device.

The sensing TFT T3 includes the drain electrode connected to the source electrode of the driving TFT T2, the source electrode connected to the reference line, and the gate electrode connected to the sensing gate line. The sensing TFT T3 senses the threshold voltage of the driving TFT T2.

The auxiliary TFT T4 includes the drain electrode connected to a cathode of the light emitting element E, the source electrode connected to the reference line, and the gate electrode connected to an auxiliary gate line Vag. The auxiliary TFT T4 is turned off in the light emission period to transfer a low potential voltage (i.e., the Vss voltage) to the cathode of the light emitting element E.

Figure 3:
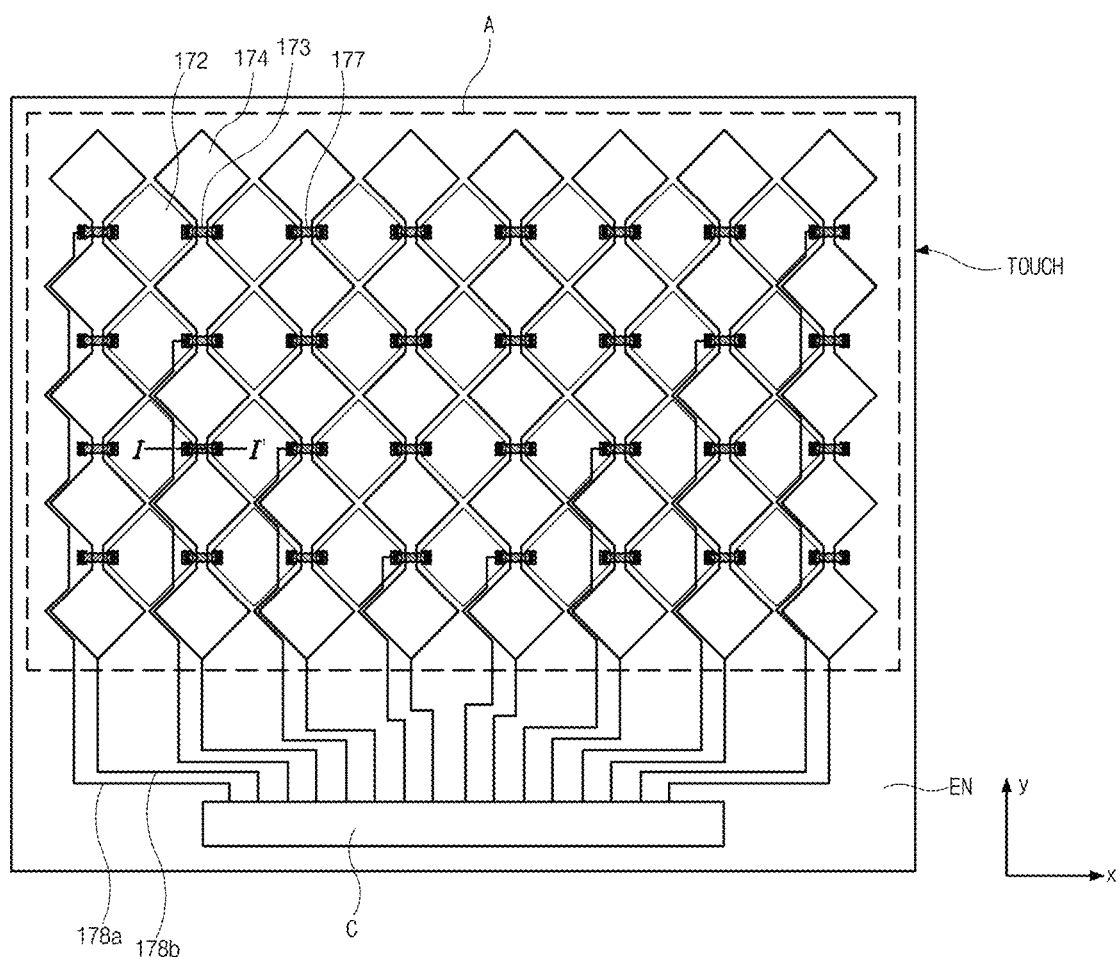
FIG. 3 is a plan view specifically illustrating a structure of a touch sensor of the display device according to the present disclosure.

FIG. 3 is a plan view illustrating the structure of the touch sensor TOUCH of the display device 100 according to the present disclosure.

As shown in FIG. 3, an electrode unit A is formed over the encapsulation layer EN. In the electrode unit A, a plurality of first touch electrodes 172 and a plurality of second touch electrodes 174 are arranged along the first direction (for example, x-direction) and the second direction (y-direction). The plurality of first touch electrodes 172 are electrically connected to each other in the first direction and the plurality of second touch electrodes 174 are electrically connected to each other in the second direction.

The first touch electrodes 172 and the second touch electrodes 174 are alternately positioned along the first direction and the second direction, and the first touch electrode 172 is disposed between the second touch electrodes 174 and the second touch electrode 174 is positioned between the first touch electrodes 172.

Further, a plurality of first routing lines 178a connected to each of the first touch electrodes 172 and a plurality of second routing lines 178b connected to each of the second touch electrodes 174 are formed in the electrode unit A.

The first touch electrode 172 may be formed in a triangle, a quadrangle, a rhombus, a polygon, or the like, but is not limited these shapes and may be formed in various shapes.

A bridge 177 is formed between the first touch electrodes 172 adjacent to each other to electrically connect the plurality of first touch electrodes 172 adjacent to each other in the second direction.

The second touch electrode 174 may be formed in a triangle, a quadrangle, a rhombus, a polygon, or the like, but is not limited these shapes and may be formed in various shapes.

A connecting pattern 173 is formed between the second touch electrodes 174 adjacent to each other to electrically connect the plurality of second touch electrodes 174 adjacent to each other in the first direction.

Although not shown in the figure, the insulting layer is formed between the first and second touch electrodes 172 and 174 and the bridge 177, so that the adjacent first touch electrodes 172 are electrically connected by bridge 177 at the intersection of the first touch electrode 172 and the second touch electrode 174. The connection pattern 173 is integrally formed with second touch electrode 174 to connect electrically the adjacent second touch electrodes 174.

The first touch electrode 172, the second touch electrode 174, and the connection pattern 173 are formed of transparent metal oxide such as ITO (Indium Tin Oxide) and IZO (Indium Zinc Oxide), but are not limited thereto and may be formed of various materials. Further, the bridge 177 may be made of a transparent metal oxide such as ITO or IZO, or a metal such as Al, Mo, Cu, and Cr, and an alloy thereof, but is not limited thereto.

The first touch electrode 172 and the second touch electrode 174 are respectively connected to a touch driving unit C through the first routing line 178a and the second routing line 178b.

The touch driving unit C is connected to the first touch electrode 172 through the plurality of first routing lines 178a to supply a touch driving signal to the first touch electrode 172 and connected to the second touch electrode 174 through the plurality of second routing lines 178b to supply a touch sensing signal to the second touch electrode 174, thereby the position of the touch may be detected.

The touch driving unit C may be formed over the encapsulation layer EN or inside the display panel PANEL.

Hereinafter, the display device according to the present disclosure will be described in detail accompanying the drawings.

Figure 4:
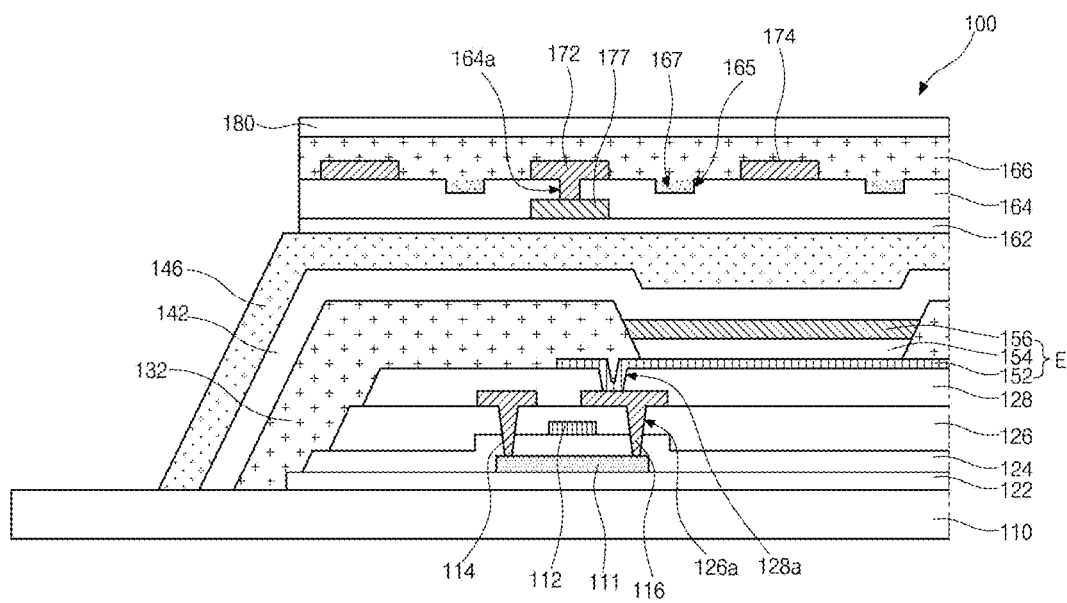
FIG. 4 is a cross sectional view illustrating the structure of the display device according to a first embodiment of the present disclosure.

FIG. 4 is a cross-sectional view illustrating the structure of the display device 100 according to the first embodiment of the present disclosure. This display device 100 is an organic light emitting display device. Substantially, the organic light emitting display device 100 includes a plurality of pixels consisting of n×m (here, n and m are natural numbers) pixels, but only one pixel and an outer region are illustrated in the drawings for convenience of description.

In the display device 100 of the present disclosure, as shown in FIG. 4, a buffer layer 122 is formed on a first substrate 110 and a driving thin film transistor (TFT) is formed on the first buffer layer 122.

The first substrate 110 is made of transparent material such as a glass. However, the material of the first substrate 110 is not limited to the glass. In the present disclosure, the first substrate 110 may be made of a transparent and flexible plastic-based material such as polyimide.

The first buffer layer 122 may be formed in single inorganic layer or multi layers having inorganic layer and organic layer. In case where the inorganic layer is made of inorganic material such as SiOx or SiNx the organic layer is made of organic material such as photo acryl. However, the inorganic layer and the organic layer is not limited to these materials.

In case of the first substrate is made of the flexible material such as the plastic base material, the first buffer layer 122 blocks the impurities such as air and moisture through the first substrate to prevent the deterioration of the organic light emitting layer.

The driving TFT includes a semiconductor layer 111 on the buffer layer 122 in a pixel, a gate insulating layer 124 over the whole area of the first substrate 110, a gate electrode 112 on the gate insulating layer 124, a first interlayer 126 over the first substrate 110 to cover the gate electrode 112, and a drain electrode 114 and a source electrode 116 on the first interlayer 126 contacting with the semiconductor layer 111 through a first contact hole 126a formed in the gate insulating layer 124 and the first interlayer 126.

The semiconductor layer 111 may be formed with a crystalline silicon or an oxide semiconductor material such as IGZO (indium gallium zinc oxide). When the semiconductor layer 111 is formed with the oxide semiconductor material, the oxide semiconductor layer includes a channel layer in a center region thereof and doping layers at both sides of the channel layer. The drain electrode 114 and the source electrode 116 are contacted with the doping layer. The semiconductor layer 111 may also be formed with an amorphous silicon or an organic semiconductor material.

The gate electrode 112 is formed in single layer or multi layers made of the metal such as Cr, Mo, Ta, Cu, Ti, Al, or Al alloy. The gate insulating layer 124 is formed in single layer made of the inorganic material such as SiOx or SiNx, or in double inorganic layers made of SiOx and SiNx. The first interlayer 126 is formed in the single layer or the multi layers made of the inorganic material such as SiOx or SiNx. However, the first interlayer 126 is not limited to these materials.

The drain electrode 114 and the source electrode 116 are made of the metal such as Cr, Mo, Ta, Cu, Ti, Al, or Al alloy, but it is not limited to these metals.

In the description and drawings, the driving TFT is formed in the specific structure, but the driving TFT of this present disclosure is not limited this structure. Any structure of the driving TFT can be applied.

A first passivation layer 128 is formed over the first substrate 110 to cover the driving TFT. Although not shown in the figure, a planarization layer may be formed on the first passivation layer 128.

The first passivation layer 128 is formed of the single layer made of the inorganic material and the multi layers made of the inorganic and the organic materials. The planarization layer may be made of the inorganic layer such as photo acryl, but it is not limited to this material.

An organic light emitting element E is formed on the first passivation layer 128 and connected to the source electrode 116 of the driving TFT through a second contact hole 128a formed in the first passivation layer 128.

The organic light emitting element E includes a first electrode 152 connected to the source electrode 116 of the driving TFT through the second contact hole 128a, an organic light emitting layer 154 on the first electrode 152, and a second electrode 156 on the organic light emitting layer 154.

The first electrode 152 is formed in the single layer or multi layers made of the metal such as Ca, Ba, Mg, Al, Ag, or alloy thereof. The first electrode 152 is connected to the source electrode 116 of the driving TFT to be applied an image signal from the outside. The first electrode 152 acts as a reflective layer to reflect light emitted from the organic light emitting layer 154 in an upper direction (i.e., in a direction opposite to the first substrate 110).

The second electrode 156 is made of the transparent metal oxide such as ITO or IZO, but it is not limited these materials.

When the organic light emitting display panel PANEL is a lower light emitting display panel in which the light emitted from the organic light emitting layer 154 is output downward, that is, toward the first substrate 110, the first electrode 152 may be made of the transparent metal oxide and the second electrode 156 may be made of the metal or the metal compound that reflects light. In this structure, the touch sensor TOUCH is disposed under the organic light emitting display panel PANEL for displaying the image.

The organic light emitting layer 154 includes an R-organic light emitting layer for emitting red monochromatic light, a G-organic light emitting layer for emitting green monochromatic light, and a B-organic light emitting layer for emitting blue monochromatic light which are respectively disposed in R, G, B pixels. Further, the organic light emitting layer 154 may be a W-organic light emitting layer for emitting white light. When the organic light emitting layer 154 is the W-organic light emitting layer, R, G, B color filter layers are formed in the upper region of the W-organic light emitting layer of the R, G, and B pixels to convert white light emitted from the W-organic light emitting layer into red, green, and blue monochromatic light. The W-organic light emitting layer may be formed by mixing a plurality of organic materials each emitting red, green, and blue monochromatic lights, or may be formed by stacking the R-organic light emitting layer, the G-organic light emitting layer, and the B-organic light emitting layer.

The organic light emitting layer 154 may be an inorganic light emitting layer made of an inorganic light emitting material such as a quantum dot.

Although not shown in the figure, the organic light emitting layer 154 may include an electron injection layer and a hole injection layer for injecting respectively electrons and holes into the emitting layer, and an electron transport layer and a hole transport layer for transporting respectively the injected electrons and holes to the emitting layer. Further, although not shown in the figure, the organic light emitting layer 154 may include an electron blocking layer or/and a hole blocking layer.

In the figure, the organic light emitting layer 154 and the second electrode 156 are respectively formed in the sub-pixels and then separated from organic light emitting layer 154 and the second electrode 156 in the adjacent sub-pixel. However, the organic light emitting layer 154 is continuously formed in a plurality of sub-pixels arranged in the row or the column, and the second electrode 156 is continuously formed in the plurality of sub-pixels arranged in the row or the column or in the whole area of the display device 100.

A bank layer 132 is formed in the boundary area of the pixel on the first passivation layer 128. The bank layer 132 is a barrier to divide each pixel to minimize mix of light of different colors from adjacent pixels.

The bank layer 132 may be made of the organic material such as acrylic based resin, epoxy based resin, phenol resin, polyamide based resin, polyimide based resin, unsaturated polyester based resin, polyphenylene based resin, polyphenylene sulfide based resin, benzo-cyclo-butene, photoresist, but is not limited to these materials.

In the structure of the figure, the bank layer 132 disposed in the outer region of the display device 100 is extended to outside of elements of the display device 100 to cover the side end surface of the buffer layer 122, the gate insulating layer 124, the first interlayer 126, and the first passivation layer 128. However, the bank layer 132 at the edge area of the display device 100 may be only on the first passivation layer 128 or may be formed to cover only the side end surface of some of the buffer layer 122, the gate insulating layer 124, the first interlayer 126, and the first passivation layer 128.

Although the bank layer 132 is composed of single layer in the figure, the bank layer 132 may be composed of double layers. In case of the bank layer of the double layers, a lower layer of the bank layer 132 may be made of hydrophilic material and an upper layer of the bank layer 132 may be made of hydrophobic material.

A first encapsulation layer 142 is formed on the light emitting element E and the bank layer 132. The first encapsulation layer 142 is made of the inorganic material such as SiNx and SiOx, but is not limited to these materials.

A second encapsulation layer 146 made of the organic material is formed on the first encapsulation layer 142. As the second encapsulation layer 146, the organic materials such as PET, PEN (Polyethylene naphthalate), PC, PI, polyethylene sulfonate, polyoxymethylene, PAR (polyarylate), and mixed materials thereof may be used.

The first encapsulation layer 142 and the second encapsulation layer 146 are extended on the upper surface of the first substrate 110 at the edge area thereof to cover completely the side surface of the buffer layer 122, the gate insulating layer 124, the first interlayer 126, the first passivation layer 128, and the bank layer 132. Thus, the display device 100 is completely sealed by the first encapsulation layer 142 and the second encapsulation layer 146 so that the foreign substances such as moisture or air are not permeated to the inside of the organic light emitting layer 154.

Although not shown in the figure, at least one partition wall covered by the first encapsulation layer 142 and the second encapsulation layer 146 may be formed in the outer region of the display device to block the propagation of crack when the crack is occurred in at least one of the first encapsulation layer 142 and the second encapsulation layer 146.

Although not shown in the figure, a plurality of encapsulation layers made of inorganic material and organic material may be formed on the second encapsulation layer 146. The encapsulation layers may be formed in the various structures according to the size and the use of the display device 100.

A second buffer layer 162 is formed over the second encapsulation layer 146. The second buffer layer 162 is used for touch sensor and may be made of the inorganic material such as SiOx or SiNx.

Further, the bridge 177 is formed on the second buffer layer 162 and a second interlayer 164 is formed on the second buffer layer 162 to cover the bridge 177. The second interlayer 164 may be made of the inorganic material such as SiOx or SiNx, but is not limited thereto.

The first touch electrode 172 and the second touch electrode 174 are formed on the second interlayer 164. The first touch electrode 172 and the second touch electrode 174 may be formed in a shape and arrangement as shown in FIG. 3, but are not limited thereto. The first touch electrode 172 and the second touch electrode 174 may be formed in various shapes and arrangements.

The first touch electrode 172 on the second interlayer 164 is connected electrically to the bridge 177 on the second buffer layer 162 through the third contact hole 164a formed in the second interlayer 164. Accordingly, the plurality of first touch electrodes 172 arranged along the first direction on the second interlayer 164 are electrically connected to each other by the bridge 177.

Further, although not shown in the figure, the connection pattern is formed on the second interlayer 164 so that a plurality of second touch electrodes 174 arranged along a second direction, which is the different direction from the first direction, are electrically connected to each other.

A second passivation layer 166 is formed on the second interlayer 164 having the first touch electrode 172 and the second touch electrode 174 thereon. The second passivation layer 166 may be made of the organic material such as photo acryl.

A second substrate 180 is disposed on the second passivation layer 166. Although not shown in the figure, the second substrate 180 is attached to the second passivation layer 166 by the optical adhesive such as OCA (optical clear adhesive) or OCR (optical clear resin). The second substrate 180 is an encapsulation cap for encapsulating display device 100 and is composed of protect film such as a PS (polystyrene) film, a PE (polyethylene) film, a PEN film, or a PI film, but is not limited thereto.

As described above, in the display device 100 according to a first embodiment of the present disclosure, the display device 100 of TOE (touch sensor on the thin film encapsulation) structure having the touch sensor on the encapsulation layer is fabricated by forming the second buffer layer 162 over the first encapsulation layer 142 and the second encapsulation layer 146 and then forming the first touch electrode 172, the second touch electrode 174, the bridge 177, and the connection pattern (not shown in FIG. 4) over the second buffer layer 162.

Meanwhile, in the display device 100 according to the first embodiment of the present disclosure, a plurality of concave portions 165 are formed in the second interlayer 164 and the second passivation layer 166 is filled therein. The second passivation layer 166 inside the concave portion 165 formed in the second interlayer 164 is an adhesive reinforcing portion 167 for reinforcing the adhesion force of the second passivation layer 166. By reinforcing the adhesive force by the adhesive reinforcing portion 167, the separation of the second passivation layer 166 from the display device 100 may be prevented.

The second passivation layer 166 is made of the organic material such as the photo acryl. The photo acryl has a good flatness, but bad boundary condition. In case where the second passivation layer 166 is made of the photo acryl, thus, the boundary characteristics between the second passivation layer 166 made of the organic material and the second interlayer 164 made of the inorganic material are deteriorated. By this deterioration of the boundary characteristics, the defects that the second passivation layer 166 is separated from the display device 100 may be occurred when manufacturing the display device 100 or after completion of the display device 100.

In the present disclosure, in order to prevent separation of the second passivation layer 166 from the display device 100, the adhesive reinforcing portion 167 is formed on the second passivation layer 166. Since the adhesive reinforcing portion 167 is formed in the concave portion 165 formed in the second interlayer 164, the contact area between the second passivation layer 166 and the second interlayer 164 is increased. Thus, the adhesion force between the second passivation layer 166 and the second interlayer 164 increases because of the increase of the contact area.

The concave portion 165 may be formed when the third contact hole 164a is formed, but is not limited thereto. In the figure, the concave portion 165 and the adhesive reinforcing portion 167 may be formed in a specific shape and in a specific number. For example, the concave portion 165 and the adhesive reinforcing portion 167 may be formed in each region between the first touch electrode 172 and the second touch electrode 174. However, the concave portion 165 and the adhesive reinforcing portion 167 are not limited to the specific positions, the specific shapes, and the specific numbers.

In the present disclosure, since the concave portion 165 and the adhesive reinforcing portion 167 increase the contact area between the second passivation layer 166 and the second interlayer 164, the position, the shape, and the numbers of the concave portion 165 and the adhesive reinforcing portion 167 may be set in the various ways as long as the contact area between the second passivation layer 166 and the second interlayer 164 can be increased.

However, it is preferable that the concave portion 165 and the adhesive reinforcing portion 167 is formed in each region between the first touch electrode 172 and the second touch electrode 174 so as to enhance the effective adhesion.

FIGS. 5A to 5D are views illustrating respectively the structure of the concave portion 165 and the adhesive enhancing portion 167 in the display device 100 according to the first embodiment of the present disclosure.

Figure 5A:
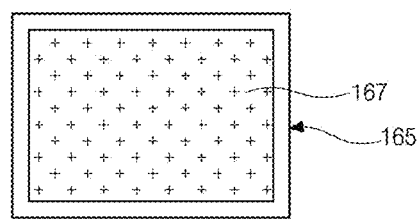
FIGS. 5A to 5D are views illustrating a concave portion and an adhesive reinforcing portion in the display device according to the first embodiment.
Figure 5B:
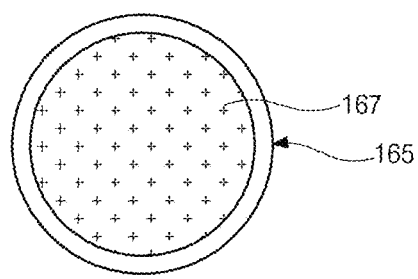

As shown in FIGS. 5A and 5B, in the display device 100 according to the first embodiment of the present disclosure, the concave portion 165 and the adhesive reinforcing portion 167 are formed one by one in circular shape or rectangular shape at a setting area, for example, the area between the first touch electrode 172 and the second touch electrode 174. The concave portion 165 and the adhesive reinforcing portion 167 may be formed in an elliptical shape or a polygonal shape such as a triangular shape and a pentagonal shape.

Figure 5C:
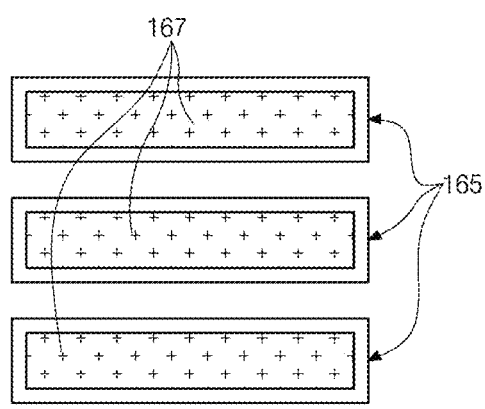
Figure 5D:
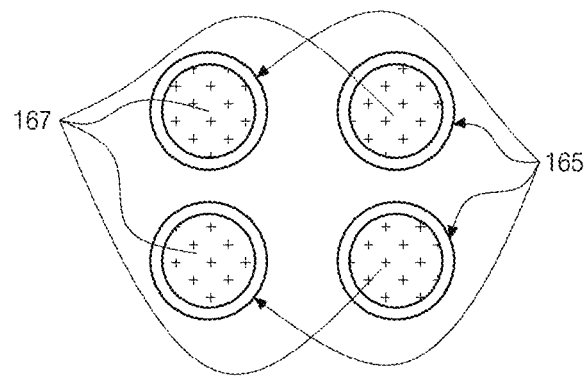

As shown in FIGS. 5C and 5D, in the display device 100 according to the first embodiment of the present disclosure, the concave portion 165 and the adhesive reinforcing portion 167 may be formed in plural circular shapes or plural rectangular shapes at the set area (for example, the area between the first touch electrode 172 and the second touch electrode 174). However, the concave portion 165 and the adhesive reinforcing portion 167 of the present disclosure are not limited to these positions and shapes, but may be formed in various shapes at various positions.

Hereinafter, the method of manufacturing the display device 100 according to the first embodiment of the present disclosure will be described in detail accompanying drawings.

FIGS. 6A to 6F are vies illustrating the method of manufacturing the display device 100 according to the first embodiment of present disclosure.

Figure 6A:
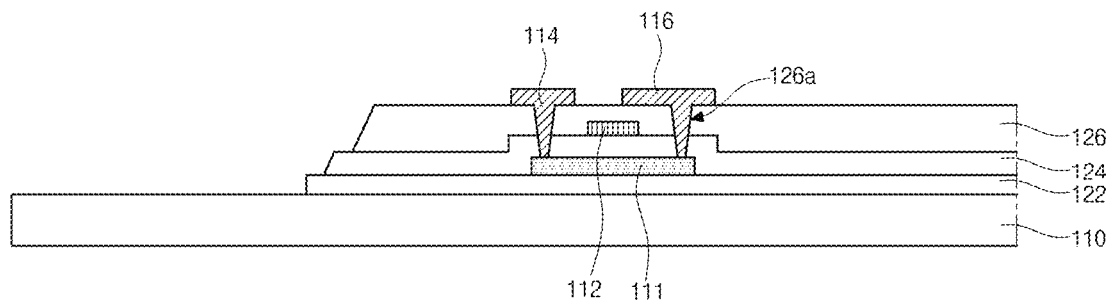
FIGS. 6A to 6F are views illustrating a method of manufacturing the display device according to the first embodiment.

As shown in FIG. 6A, the inorganic material such as SiOx or SiNx is first deposited on the whole area of the first substrate 110 made of the transparent material such as the glass or the plastic, or the inorganic material or the organic material such as the photo acryl are deposited on the whole area of the first substrate 110 in order to form the first buffer layer 122 composed of the single layer or the multi layers.

Subsequently, the oxide semiconductor or the crystalline silicon is deposited over the whole area of the first substrate 110 by a CVD (chemical vapor deposition) method and then etched it to form the semiconductor layer 111. In this case, the crystalline silicon layer may be formed by directly coating the crystalline silicon or may be formed by coating the amorphous silicon and then crystallizing the amorphous silicon by various crystallization methods such as laser crystallization. The doped layer may be formed by doping n+ or p+ type impurities on both sides of the crystalline silicon layer.

Thereafter, the inorganic insulating material such as SiOx or SiNx is deposited on the semiconductor layer 111 by the CVD method to form the gate insulating layer 124. And, the opaque metal having good conductivity such as Cr, Mo, Ta, Cu, Ti, Al, or Al alloy is deposited on the gate insulating layer 124 by sputtering method and then etched to form the gate electrode on the gate insulating layer 124.

Subsequently, the inorganic material is deposited over the whole area of the first substrate 1100 by the CVD method to form the first interlayer 126 to cover the gate electrode 112 and then the first interlayer 126 is etched to form the first contact hole 126a in the both sides of the semiconductor layer 111.

Thereafter, the opaque metal having good conductivity, such as Cr, Mo, Ta, Cu, Ti, Al, or Al alloy, is deposited over the whole area of the first substrate 110 by the sputtering method and then etched the deposited metal to form the drain electrode 114 and the source electrode 116 connected electrically to the semiconductor layer 111 through the first contact hole 126a, thereby the driving TFT is completely fabricated.

Figure 6B:
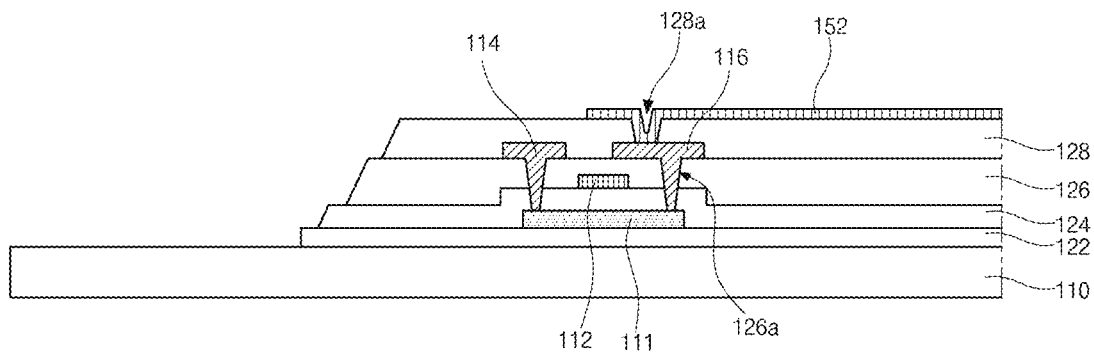

Subsequently, as shown in FIG. 6B, the organic material such as the photo acryl is deposited over the whole area of the first substrate 110 on which the drain electrode 114 and the source electrode 116 are formed to form the first passivation layer 128 and then a part of the first passivation layer 128 is etched to form the second contact hole 128a for exposing a part of the source electrode 116 of the driving TFT.

Thereafter, the metal such as Ca, Ba, Mg, Al, and Ag is deposited by the sputtering method and then the deposited metal is etched to form the first electrode 152 connected to the source electrode 116 of the driving TFT through the second contact hole 128a.

Figure 6C:
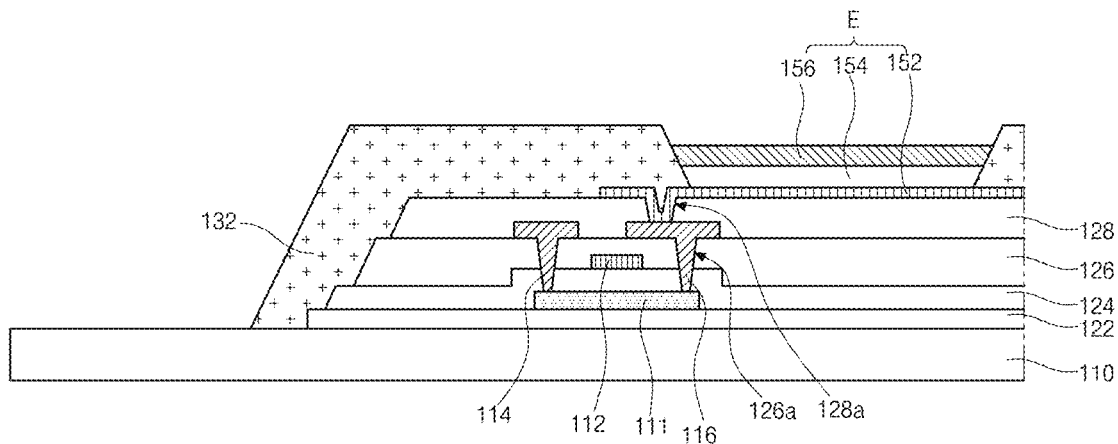

As shown in FIG. 6C, thereafter, the organic material such as acrylic based resin, epoxy based resin, phenol resin, polyamide based resin, polyimide based resin, unsaturated polyester based resin, polyphenylene based resin, polyphenylene sulfide based resin, benzo-cyclo-butene, and photoresist is deposited, and then the deposited organic material is etched to form the bank layer 132.

Subsequently, the organic light emitting material and the transparent metal oxide such as ITO and IZO are deposited by the sputtering method to form the organic light emitting layer 154 and the second electrode 156. Although not shown in the figure, the electron injection layer, the hole injection layer, the electron transport layer, the hole transport layer, the electron blocking layer, and the hole blocking layer may be formed when forming the organic light emitting layer 154.

Figure 6D:
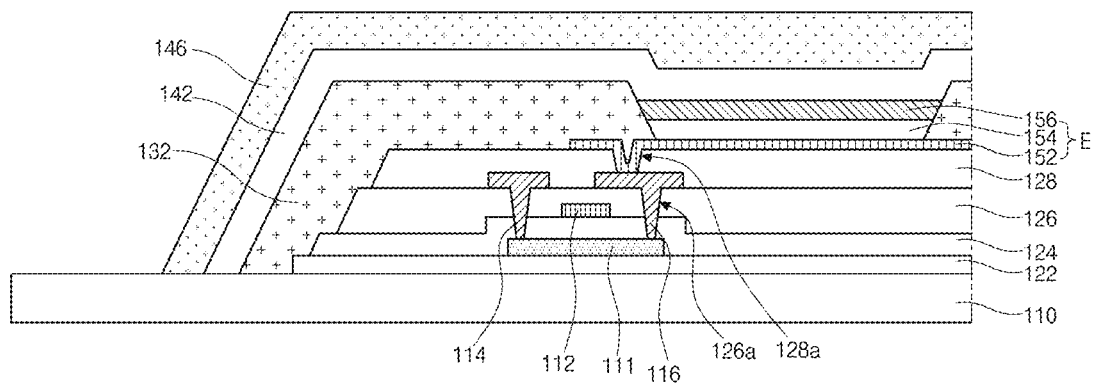

Subsequently, as shown in FIG. 6D, the inorganic such as SiOx or SiNx is deposited over the whole area of the first substrate 110 to form the first encapsulation layer 142 over the bank layer 132 and the second electrode 156. In this time, the first encapsulation layer 142 is extended to the outer region of the display device 100 to cover the side surface of the bank layer 132 and the upper surface of the first substrate 110 in the outer region thereof.

Subsequently, the organic material such as such as PET, PEN, PC, PI, polyethylene sulfonate, polyoxymethylene, and mixed materials thereof is deposited over the whole area of the first substrate 110 to form the second encapsulation layer 146 on the first encapsulation layer 142. In this time, the second encapsulation layer 146 is extended to the outer region of the display device 100 to cover the side surface of the first encapsulation layer 142 and the upper surface of the first substrate 110 in the outer region thereof.

Figure 6E:
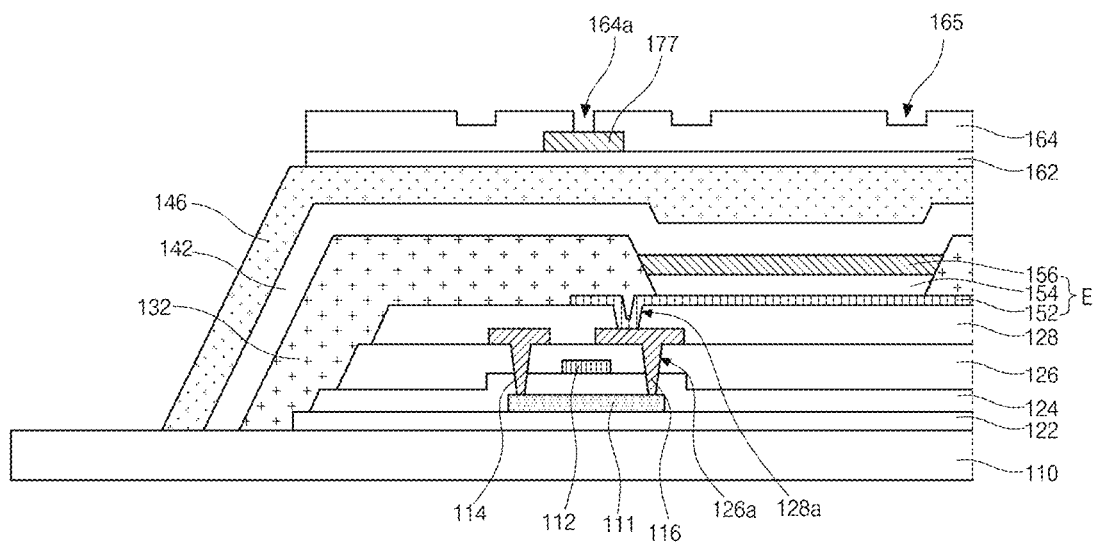

Thereafter, as shown in FIG. 6E, the organic material is deposited on the second encapsulation layer 146 to form the second buffer layer 162 and then transparent metal oxide or metal is deposited and etched to form the bridge 177 on the second buffer layer 162.

Subsequently, the inorganic material is deposited on the second buffer layer 162 having the bridge 177 thereon to form the second interlayer 164 and then the second interlayer is etched to form the third contact hole 164a and the concave portions 165. In this time, the second interlayer 164 on the bridge 177 is completely removed to from the third contact hole 164a and the second interlayer 164 is partially removed to form the concave portions 165.

The third contact hole 164a and the concave portion 165 may be formed by separate photolithography processes, or may be formed by one photolithography process using a halftone mask or diffraction mask.

Figure 6F:
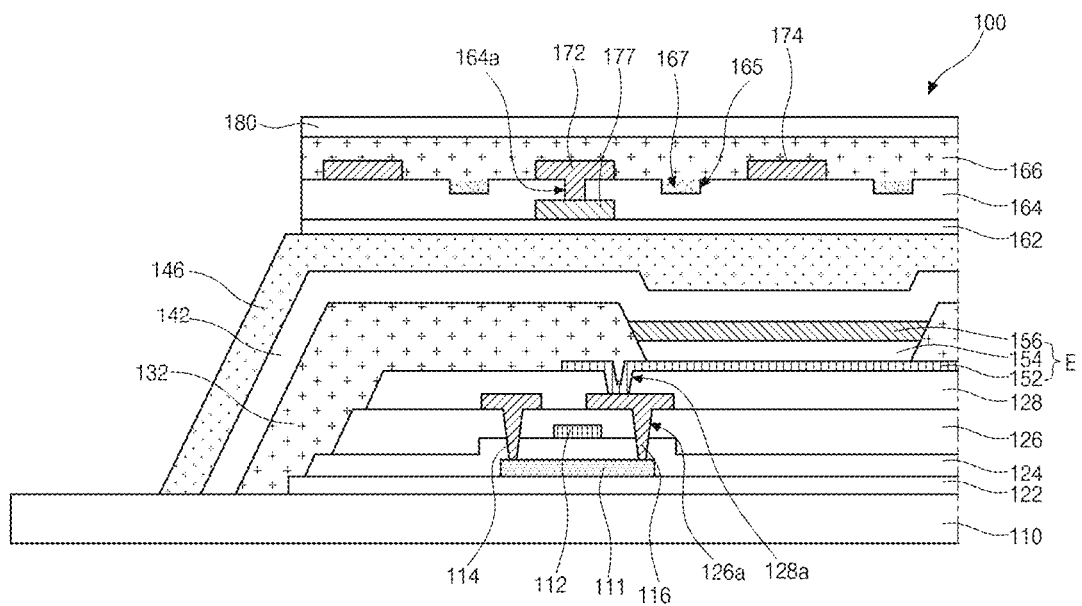

Thereafter, as shown in FIG. 6F, the transparent metal oxide or metal such as ITO or IZO is deposited over the whole area of the first substrate 110 and etched to form the first touch electrode 172 and the second touch electrode 174, and then the organic material such as photo acryl is deposited to form the second passivation layer 166 on the second interlayer 164.

The plurality of first touch electrodes 172 are electrically connected to the bridge 177 through the third contact hole 164a formed in the second interlayer 164 so that the plurality of first touch electrodes 172 arranged along the first direction are connected electrically to each other. The plurality of second touch electrodes 174 arranged along the second direction perpendicular to the first direction are connected electrically by the connection pattern, which is not shown in the figure.

Further, the second passivation layer 166 is also formed in the concave portion 165 formed in the second interlayer 164 to form the adhesive reinforcing portion 167 for increasing the contact area between the second passivation layer 166 and the second interlayer 164. The adhesive reinforcing portion 167 is made of the organic material such as photo acryl, which is the same material as the second passivation layer 166.

Subsequently, the second substrate 180 composed of the protection film such as PS film, PE film, PEN film, or PI film is attached on the second passivation layer 166 by the optical transparent adhesive such as OCA or OCR, thereby the display device 100 is fabricated.

As described above, in the display device 100 according to the present disclosure, the second passivation layer 166 is not separated from the display device 100 by increasing the contact area between the second passivation layer 166 made of the organic material and the second interlayer 164 on the touch sensor.

Therefore, in the present present disclosure, if the contact area between the second passivation layer 166 and the second interlayer 164 can be improved, the contact structure between the second passivation layer 166 and the second interlayer 164 can be formed in the various shapes to increase the contact structure between the second passivation layer 166 and the second interlayer 164.

Figure 7:
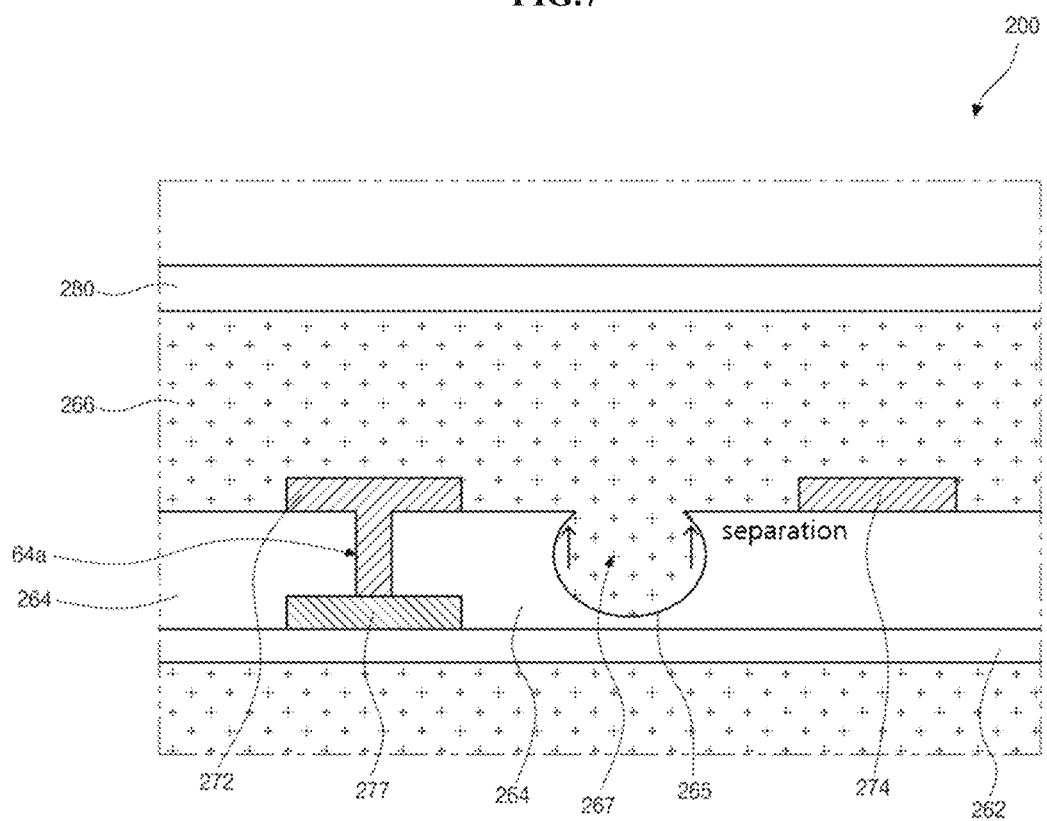
FIG. 7 is a partially enlarged cross sectional view of the display device according to a second embodiment of the present disclosure.

FIG. 7 is a partially enlarged cross sectional view of the display device 200 according to a second embodiment of present disclosure, and is a view illustrating another contact structure between the second passivation layer 266 and the second interlayer 264. Hereinafter, the description of the same structure as in the first embodiment will be omitted or simplified, and only other structures will be described in detail.

As shown in FIG. 7, in the display device 200 according to the second embodiment of the present disclosure, the second interlayer 264 is formed on the second buffer layer 262 and the second passivation layer 266 is formed on the second interlayer 264. The second substrate 280 is attached on the second passivation layer 266 by the optical adhesive layer (not shown in the figure) such as OCA or OCR.

The bridge 277 is formed on the second buffer layer 262, and the first touch electrode 272 and the second touch electrode 274 are formed on the second interlayer 264. The third contact hole 264a is formed in the second interlayer 264 so that the first touch electrode 272 is electrically connected to the bridge 277 through the third contact hole 264a.

Further, the concave portion 265 is formed in the second interlayer 264 and the adhesive reinforcing portion 267 is formed by filling the organic material in the concave portion 265. The concave portion 265 and the adhesive reinforcing portion 267 increases the contact area between the second passivation layer 266 and the second interlayer 264 so that the adhesion force between the second passivation layer and the second interlayer 264 is also increased.

An entrance of the concave portion 265 is formed a smaller shape than that of the lower region thereof. That is, the concave portion 265 is formed in an undercut shape in which the volume of the second interlayer 264 is larger than the entrance. Due to this undercut shape of the concave portion 265, the entrance of the concave portion 265 acts as a stopper to stop the separation when the second passivation layer 266 is separated from the second interlayer 264, it is possible to more efficiently prevent the separation of the second passivation layer 266 from the second interlayer 264.

Further, since concave portion 265 is formed in the undercut shape whose lower portion is larger than the entrance, the contact area between the second passivation layer 266 and the second interlayer 264 may be further increased and thus adhesion force between the second passivation layer 266 and the second interlayer 264 may be further improved.

The concave portion 265 may be formed by isotropic etching the second interlayer 264, but is not limited thereto. The concave portion 265 may be formed in various shapes such as a circular shape, a square shape, and a rectangular shape when viewed in a plan view.

Figure 8:
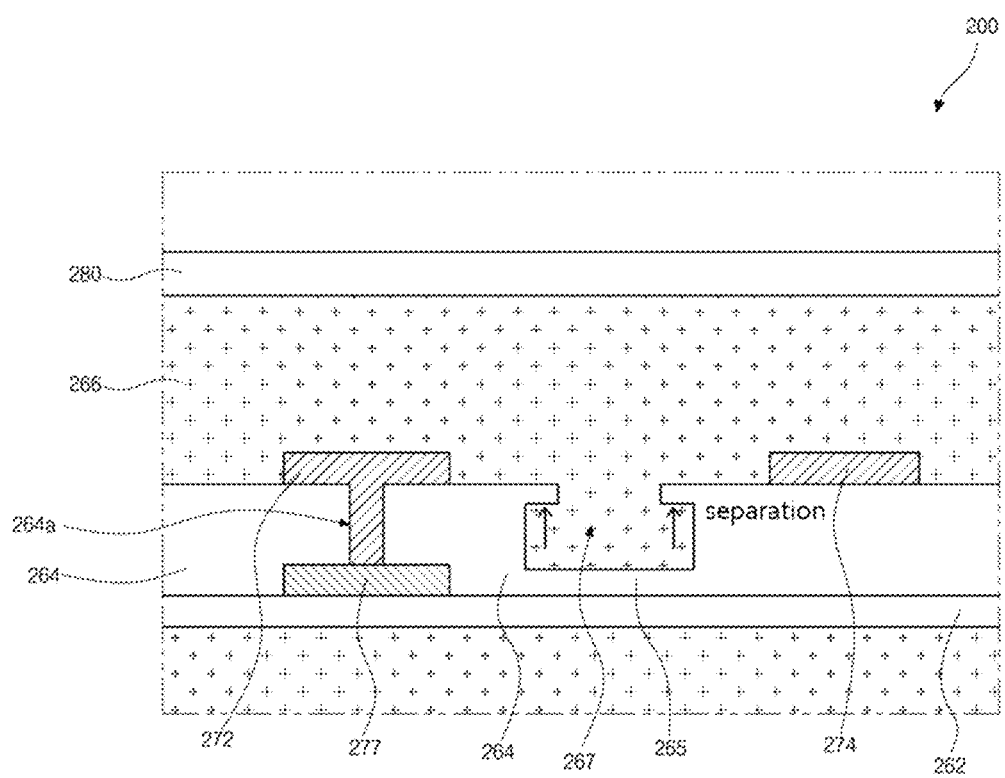
FIG. 8 is a partially enlarged cross sectional view illustrating other structure of the display device according to the second embodiment.

FIG. 8 is a partially enlarged cross sectional view of the display device 200 according to the second embodiment of present disclosure, and is a view illustrating other shape of the concave portion 265.

As shown in FIG. 8, in the display device 200 having this structure, the concave portion 265 is formed in the rectangular shape in cross section. The entrance of the concave portion 265 is formed of the second interlayer 264 having the predetermined thickness and the width of the lower inner space is formed larger than the width of the entrance. The inside of the concave portion 265 is filled with the organic material forming the second passivation layer 266 to form an adhesive reinforcing portion 267.

In the display device 200 having this structure, the contact area between the second passivation layer 266 and the second interlayer 264 is further increased due to the square shape of the space wider than the entrance, so that the adhesion force between the second passivation layer 266 and the second interlayer 264 is further improved. Further, since the entrance of the concave portion 265 acts as the stopper, it is possible to prevent more efficiently the separation of the second passivation layer 266 from the second interlayer 264.

As described above, in the second embodiment of the present disclosure, the concave portion 265 is formed in the undercut shape and the organic material of the second passivation layer 266 is formed therein, so that the adhesion force between the second passivation layer 266 and the second interlayer 264 is improved by increasing the contact area therebetween and the separation of the second passivation layer 226 from the display device 200 can be effectively prevented by the structural feature such as the undercut shape.

In this embodiment of the present disclosure, the concave portion 265 is formed in the undercut of the specific shape as shown in FIGS. 7 and 8, but the concave portion 265 is not limited to the undercut of this shape. The concave portion 265 according to this embodiment of the present disclosure can be formed in the various undercut shapes.

Figure 9:
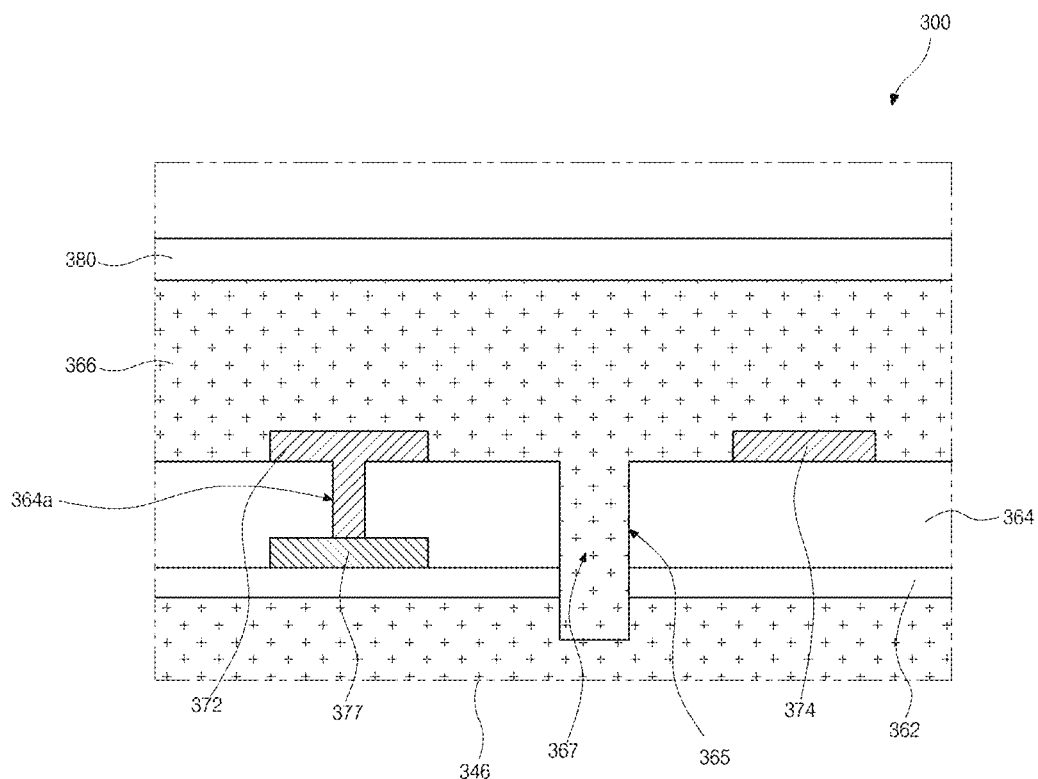
FIG. 9 is a partially enlarged cross sectional view of the display device according to a third embodiment of the present disclosure.

FIG. 9 is a partially enlarged cross sectional view of the display device 300 according to a third embodiment of the present disclosure, and is a view illustrating the contact structure between the second passivation layer 366 and other layers. Hereinafter, the description of the same structure as in the first embodiment will be omitted or simplified, and only other structures will be described in detail.

As shown in FIG. 9, in the display device 300 according to the third embodiment of the present disclosure, the second buffer layer 362 made of the inorganic material and the second interlayer 364 are formed on the second encapsulation layer 346 made of the organic material. The second passivation layer 366 is formed on the second interlayer 364 and the second substrate 380 is attached on the second passivation layer 366.

The bridge 377 is formed on the second buffer layer 362, and the first touch electrode 372 and the second touch electrode 374 are formed on the second interlayer 364. The third contact hole 364a is formed in the second interlayer 364 so that the first touch electrode 372 is electrically connected to the bridge 377 through the third contact hole 364a.

The concave portion 365 is formed in the second interlayer 364 and the second buffer layer 362. The concave portion 365 is filled with the organic material. The concave portion 365 completely penetrates the second interlayer 364 and the second buffer layer 362, the second encapsulation layer 346 is exposed through the concave portion 365. The exposed second encapsulation layer 346 is also filled with the organic material forming the second passivation layer to form the adhesive reinforcing portion 367.

Accordingly, the adhesive reinforcing portion 367 not only is contacted with the sidewalls of the second interlayer 364 and the second buffer layer 362 inside the concave portion 365, but also is contacted with the exposed portion of the second encapsulation layer, so that the contact area between the second passivation layer and other layers is much increased, thereby the adhesion force of the second passivation layer 366 to the display device 300 can be improved.

Moreover, since the second passivation layer 366 made of the organic material is contacted with the second encapsulation layer 346 made of the organic material, the boundary characteristics of the second passivation layer 366 is similar to that of the second encapsulation layer 346, whereas the boundary characteristics of the second passivation layer 366 is different from that of the second interlayer 364 and the second buffer layer 362 which are made of the inorganic material. Therefore, the adhesion force between the second passivation layer 366 and the second encapsulation layer 346 is much larger than that between the second passivation layer 366 and the second interlayer 364/the second buffer layer 362.

In addition, in this embodiment, since the concave portion 365 formed in the second encapsulation layer 346 may be formed in the undercut shape as shown in FIGS. 7 and 8, it is possible to more efficiently prevent the separation of the second passivation layer 366 from the display device 300 by the structural feature of the concave portion 365 and the adhesive reinforcing portion 367 as well as the improvement of the adhesion force.

The concave portion 365 is also formed to a predetermined depth in the second encapsulation layer 346, and the organic material forming the second passivation layer 366 is filled therein. Therefore, the contact area between the second passivation layer 366 and the second encapsulation layer 346 having similar characteristics increases, thereby further improving the adhesion between the second passivation layer 366 and the second encapsulation layer 346.

As described above, in this embodiment, the adhesion area between the second passivation layer 366 and other layers is increased and the second passivation layer 366 is contacted with the second encapsulation layer 346 having the similar boundary characteristics. Thus, the contact area of the second passivation 366 can be further increase so that it is possible to reliably prevent the separation of the second passivation layer 366 from the display device 300.

Figure 10:
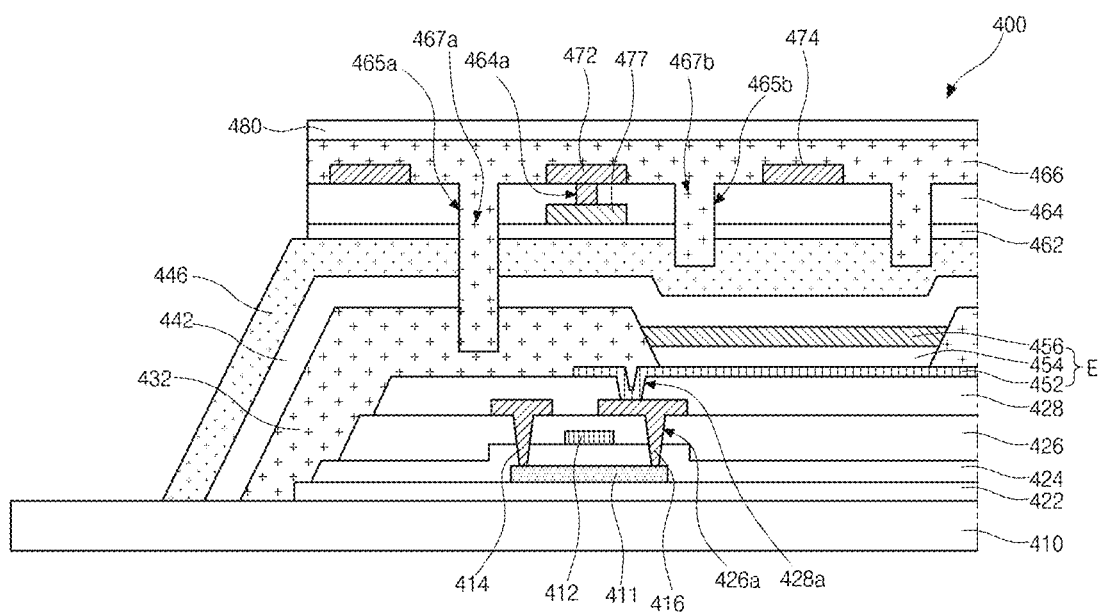
FIG. 10 is a cross-sectional view of the display device according to a fourth embodiment of the present disclosure.

FIG. 10 is a cross sectional view of the display device 400 according to a fourth embodiment of the present disclosure. Hereinafter, the description of the same structure as in the first embodiment will be omitted or simplified, and only other structures will be described in detail.

As shown in FIG. 10, each sub-pixel of the display device 400 according to this embodiment includes the driving TFT and the organic light emitting element E on the first substrate 410. The driving TFT includes the semiconductor layer 411, the gate electrode 412, the drain electrode 414, and the source electrode 416. The organic light emitting element E includes the first electrode 452, the organic light emitting layer 454, and the second electrode 456. At the area between the sub-pixels, the bank layer 432 is formed.

The display device 400 is encapsulated by the first encapsulation layer 442 made of the inorganic material and the second encapsulation layer 446 made of the organic material. Although not shown in the figure, in the display device 400 of this embodiment, in addition to the first encapsulation layer 442 and the second encapsulation layer 446, a plurality of additional encapsulation layers may be formed. Thus, it is possible to prevent the defect of the organic light emitting layer 454 caused by permeating the foreign substances such as moisture or air to the organic light emitting layer 454.

The second buffer layer 462 made of the inorganic material is formed on the second encapsulation layer 446 and the bridge 477 made of the transparent metal oxide or the metal is formed on the second buffer layer 462. Further, the second interlayer 464 is formed on the second buffer layer 462 and the first touch electrode 472 and the second touch electrode 474, which are made of the transparent metal oxide, are formed on the second interlayer 464.

The third contact hole 464a is formed in the second interlayer 464 so that the first touch electrode 472 is connected electrically to the bridge 477 through the third contact hole 464a.

The second passivation layer 466 made of the organic material is formed on the second interlayer 464. At this time, first concave portion 465a and second concave portion 465b are formed in the layer disposed under the second passivation layer 466, and the first concave portion 465a and the second concave portion 465b are filled with the organic material forming the second passivation layer 466 to form first adhesive reinforcing portion 467a and second adhesive reinforcing portion 467b.

The first concave portion 465a is formed between the sub-pixels in the region in the portion in which the bank layer 432 is formed. The first concave portion 465a is formed in the second interlayer 464, the second buffer layer 462, the second encapsulation layer 446, the first encapsulation layer 442 and the bank layer 432 so that the inside of the bank layer 432 is exposed by the first concave portion 465a. The first concave portion 465a is filled with the organic material, such as photo acryl, forming the second passivation layer 466 to form the first adhesive reinforcing portion 467a.

Accordingly, the first adhesive reinforcing portion 467a is contacted with the side walls of the second interlayer 464, the second buffer layer 462, the second encapsulation layer 446, and the first encapsulation layer 442 within the first concave portion 465a, so that the contact area between the second passivation layer 466 and other layers is much increased and thus the adhesion force of the second passivation layer 466 is much improved. The first adhesive reinforcing portion 467a made of the organic material is formed inside of the bank layer 432 made of the organic material and the second passivation layer 466 is contacted with the bank layer 432 over a large area, so that the attaching feature of the second passivation layer 466 and the bank layer 432 may be improved.

In the figure, the first concave portion 465a penetrates the second interlayer 464, the second buffer layer 462, the second encapsulation layer 446, and the first encapsulation layer 442, and is formed in bank layer 432 in the predetermined depth. However, the first concave portion 465a is not limited to this structure. That is, the first concave portion 465a penetrates only the second interlayer 464, the second buffer layer 462, the second encapsulation layer 446, and the first encapsulation layer 442, is not formed in the bank layer 432, so that the upper surface of the bank layer 432 may be exposed through the first concave portion 465a. In this structure, the first adhesive reinforcing portion 467a is contacted with the exposed portion of the bank layer 432.

The first concave portion 465a formed in the bank layer 432 to have a predetermined depth may be formed in the undercut structure illustrated in FIGS. 7 and 8.

The second concave portion 465b is formed in a region where the bank layer 432 is not disposed in the sub-pixel. The second concave portion 465b is formed in the second interlayer 464, the second buffer layer 462, and the second encapsulation layer 446. The second concave portion 465b is filled with the organic material, such as photo acryl, forming the second passivation layer 466 to form the second adhesive reinforcing portion 467b.

Accordingly, the second adhesive reinforcing portion 467b is contacted with the side walls of the second interlayer 464 and the second buffer layer 462 in the second concave portion 465b. Further, the side wall and the bottom surface of the second adhesive reinforcing portion 467b made of the organic material is contacted with the second encapsulation layer 446 made of the organic material within the second concave portion 465b, thereby the adhesion feature of between the second adhesive reinforcing portion 467b and the second encapsulation layer 446 may be improved.

In this embodiment, since the first concave portion 465a is formed in to the bank layer 432 to form the adhesive reinforcing portion 467a formed in the first concave portion 465a, the contact area between the second passivation layer 466 and other layers is increased and the second passivation layer 466 is contacted with the bank layer 432 having similar characteristics, thereby the separation of the second passivation layer 466 from the display device 400 can be effectively prevented.

At this time, in the figure, the second concave portion 465b penetrates the second interlayer 464 and the second buffer layer 462 and is formed in the second encapsulation layer 446 in a predetermined depth. However, the second concave portion 465b is made only in the second buffer layer 462 and is formed in the second encapsulation layer 446, not in the first encapsulation layer 442, so that the a part of the upper surface of the second encapsulation layer 446 is exposed through the second concave portion 465b. In this structure, the second adhesive reinforcing portion 467b is contacted with the exposed upper surface of the second encapsulation layer 446.

The second concave portion 465b formed in the second encapsulation layer 446 to have a predetermined depth be formed in the undercut structure illustrated in FIGS. 7 and 8.

As described above, in this embodiment, when the concave portion is formed only in the region between the sub-pixels, all concave portions formed in the display device 400 are formed to the inside or the upper surface of the bank layer 432 so that the adhesive reinforcing portion 467a is contacted with the inner or upper surface of the bank layer 432. Further, when the concave portion is formed not only in the region between the sub-pixels, but also inside the sub-pixel, the first concave portion 465a is formed to the inside or the upper surface of the bank layer 432 so that the first adhesive reinforcing portion 467a is contacted with the inner or upper surface of the bank layer 432 and the second concave portion 465b is formed to the inside or the upper surface of the second encapsulation layer 446 so that the second adhesive reinforcing portion 467b is contacted with the inner or upper surface of the second encapsulation layer 446.

As described above, in this embodiment, the concave portion 465a is formed to the inside or the top surface of the bank layer 432 in the region where the bank layer 432 is formed so that the adhesive reinforcing portion 467a is contacted with the inside or the top surface of the bank layer 432 to enhance adhesion.

Figure 11A:
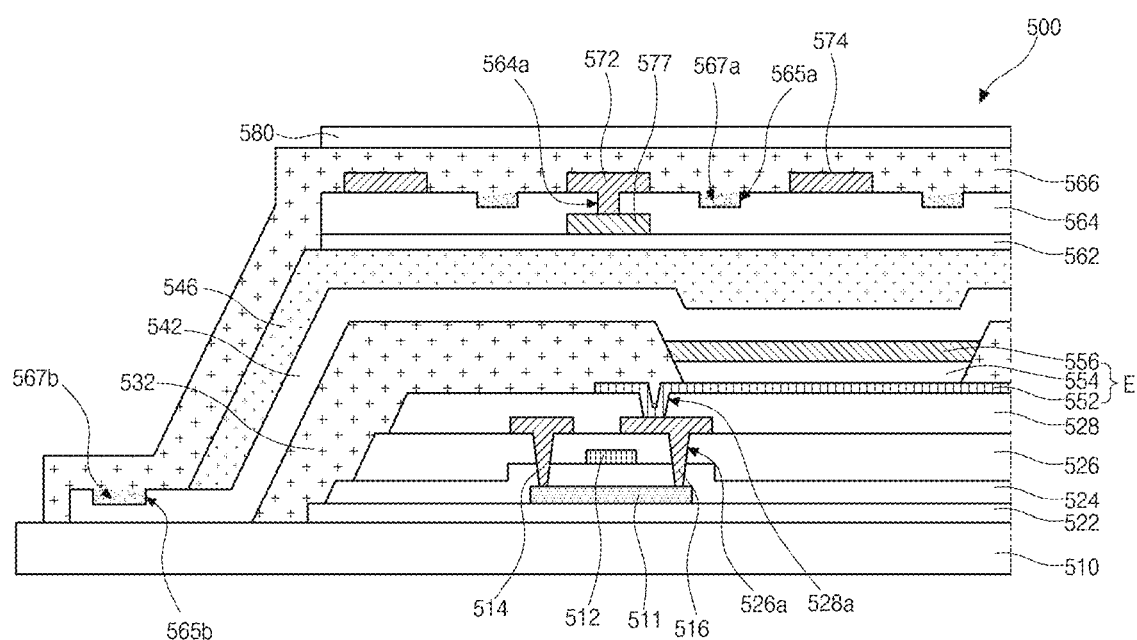
FIGS. 11A and 11B are cross sectional views illustrating the structure of the display device according to a fifth embodiment of the present disclosure.
Figure 11B:
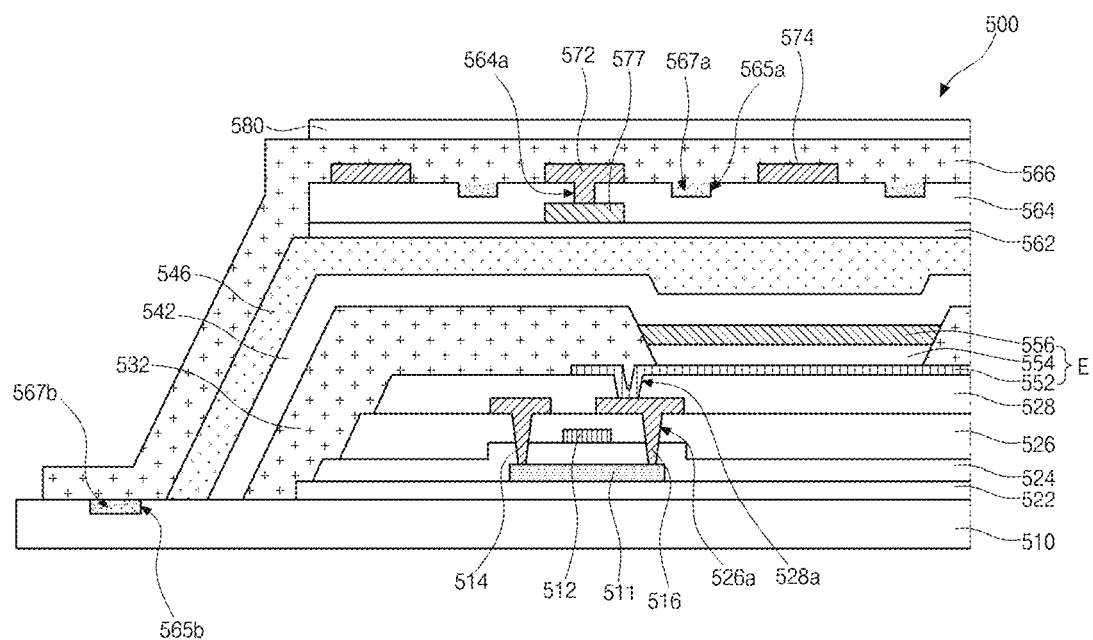

FIGS. 11A and 11B are views each illustrating the structure of the display device 500 according to a fifth embodiment of present disclosure. Hereinafter, the description of the same configuration as in the first embodiment will be omitted or simplified, and only other configurations will be described in detail.

As shown in FIG. 11A, in the display device 500 of this embodiment, the second buffer layer 562 and the second interlayer 564 are formed only on the second encapsulation layer 546, whereas the second passivation layer 566 is formed over the second interlayer 564 and extended along the sidewall of the second encapsulation layer 546 to the upper surface of the substrate 510 in the outer region of the display device 500. Further, the first encapsulation layer 542 extending to the outer region of the display device 500 is formed to extend outside the second encapsulation layer 546.

The bridge 577 is formed on the second buffer layer 562, and the first touch electrode 572 and the second touch electrode 574 are formed on the second interlayer 564. The third contact hole 564a is formed in the second interlayer 564 so that the bridge 577 and the first touch electrode 572 are electrically connected through the third contact hole 564a.

Further, the first concave portion 565a is formed in the second interlayer 564, and the first concave portion 565a is filled with the organic material forming the second passivation layer 566 to form the first adhesive reinforcing portion 567a so that the contact area between the second passivation layer 566 and the second interlayer 564 is increased to improve adhesion therebetween.

The upper surface and the lower surface of the first concave portion 565a have the same area as shown in FIG. 11A. However, the first concave portion 565a has the undercut shape in which the area of the lower portion is larger than the area of the entrance as shown in FIGS. 7 and 8. Further, the first concave portion 565a can penetrates the second interlayer 564, so that the first adhesive reinforcing portion 567a can be directly contacted with the second encapsulation layer 546 and the bank layer 532 as shown in FIGS. 9 and 10.

The second concave portion 565b is formed at the first encapsulation layer 542 extending to the outside of the second encapsulation layer 546 in the outer region of the display device 500, and the second adhesive reinforcing portion 567b is formed in the second concave portion 565b. In this case, the second concave portion 565b may also be formed in the undercut shape in which the area of the lower portion is larger than the area of the entrance (i.e., upper surface).

In the display device 500 of this embodiment, since the adhesive force enhancing portions 567a and 567b are respectively formed in the upper region and the outer portion of the display device 500, the second passivation layer 566 covers completely the upper surface and the side surfaces of the layers disposed below the second passivation layer 566. In this case, since the second adhesive reinforcing portion 567b is formed in the outer circumference, the second passivation layer 566 is in close contacted with the entire structure of the display device 500. Therefore, the separation of the second passivation layer from the display device 500 can be effectively prevented.

As shown in FIG. 11B, in the display device 500, the first encapsulation layer 542 is encapsulated by the second encapsulation layer 546, is not extended to the outside of the second encapsulation layer 546. In this structure, the second concave portion 565b is formed directly on the first substrate 110 and the second adhesive reinforcing portion 567b is formed inside the second concave portion 565b. Therefore, all structures of the display device 500 are encapsulated by the second passivation layer 566 to attach firmly the second passivation layer 566 to the structures of the display device 500, so that the separation of the second passivation layer from the display device 500 can be effectively prevented.

In the embodiments of the present disclosure, the display device may comprising a first substrate including a plurality of sub-pixels, a thin film transistor in each sub-pixel of the first substrate, an organic light emitting element in each sub-pixel of the first substrate, an insulating layer over the thin film transistor and the organic light emitting element, a touch sensor over the insulating layer, a passivation layer covering the touch sensor, and a second substrate disposed over the passivation layer, wherein a plurality of concave portions are formed in the insulating layer and the concave portion is filled with the passivation layer to form an adhesive reinforcing portion.

According to the other feature of the present disclosure, the insulating layer may include an inorganic encapsulation layer, an organic encapsulation layer over the inorganic encapsulation layer, a buffer layer over the organic encapsulation layer, and an interlayer over the buffer layer.

According to another feature of the present disclosure, the concave portion may be formed in the interlayer. Further, the concave portion may be formed in the interlayer and the buffer layer to expose the organic encapsulation layer and the adhesive reinforcing portion may be formed inside of the concave portion so that the adhesive reinforcing portion is contacted with the exposed surface of the organic encapsulation layer.

According to another feature of the present disclosure, the concave portion may penetrates the interlayer and the buffer layer and may be formed in a part of the organic encapsulation layer, and the adhesive reinforcing portion may be formed inside of the concave portion so that the adhesive reinforcing portion may be contacted with inside of the organic encapsulation layer.

According to another feature of the present disclosure, the display device may further include a bank layer between the sub-pixels, and the concave portion may be formed in the interlayer, the buffer layer, the organic encapsulation layer, and the inorganic encapsulation layer to expose a part of the surface of the bank layer, and the adhesive reinforcing portion may be formed inside of the concave portion so that the adhesive reinforcing portion may be contacted with the exposed surface of the bank layer.

According to another feature of the present disclosure, the display device may further include a bank layer between the sub-pixels, the concave portion may be formed in the interlayer, the buffer layer, the organic encapsulation layer, and the inorganic encapsulation layer and may be formed in a part of the bank layer, the adhesive reinforcing portion may be formed in the concave portion so that the adhesive reinforcing portion may be contacted with inside of the bank layer.

According to another feature of the present disclosure, the inorganic encapsulation layer and the organic encapsulation layer may be formed in an outer portion of the first substrate to encapsulate the structure thereof, and the inorganic encapsulation layer may be disposed on the first substrate outside of the organic encapsulation layer.

According to another feature of the present disclosure, the concave portion may be formed in the inorganic encapsulation layer on the first substrate and the passivation layer may be extended to the outer portion of the first substrate so that the adhesive reinforcing portion may be formed inside the concave portion.

According to another feature of the present disclosure, the concave portion may be formed in the substrate at an outer portion of the first substrate and the passivation layer may be extended to the outer portion of the first substrate so that the adhesive reinforcing portion may be formed inside of the concave portion.

According to another feature of the present disclosure, the concave portion may be formed in circular shape, elliptical shape or polygonal shape.

According to another feature of the present disclosure, the concave portion may be formed of undercut shape where area of lower portion is larger than that of entrance.

According to another feature of the present disclosure, the first substrate may be made of glass or plastic based material.

According to another feature of the present disclosure, the touch sensor may include
 a bridge on the buffer layer, a first touch electrode on the interlayer, the first touch electrode being connected electrically to the bridge through a contact hole formed in the interlayer, and a second touch electrode on the interlayer.

Various modifications of the specification or structures that can be easily created based on the specification should also be included in the scope of the specification. Accordingly, the scope of the rights of the specification should not be determined by the above detailed description, but should be determined by the appended claims. Features, structures, effects, and the like described in the examples of the present application are included in at least one example, and are not necessarily limited to only one example. Further, the features, structures, effects, and the like exemplified in at least one example of the present application may be combined or modified for other examples by person skilled in the art to which the present application belongs. Accordingly, contents related to such combinations and modifications should be construed as being included in the scope of the present application.

It will be apparent to those skilled in the art that various modifications and variations can be made in the display device having a touch sensor of the present disclosure without departing from the technical idea or scope of the disclosure. Thus, it is intended that the present disclosure cover the modifications and variations of this disclosure provided they come within the scope of the appended claims and their equivalents.

What is claimed is:

1. A display device, comprising:
 a first substrate including a plurality of sub-pixels;
 a thin film transistor in each sub-pixel of the first substrate;
 an organic light emitting element in each sub-pixel of the first substrate;
 an insulating layer over the thin film transistor and the organic light emitting element;
 a first touch electrode and a second touch electrode over the insulating layer and spaced apart from each other;
 a passivation layer covering an upper surface of each of the first touch electrode and the second touch electrode; and
 a second substrate disposed over the passivation layer,
 wherein a plurality of first concave portions are formed in the insulating layer, and a concave portion among the plurality of first concave portions is filled with the passivation layer to form an adhesive reinforcing portion.

2. The display device of claim 1, wherein the insulating layer includes:
 an inorganic encapsulation layer;
 an organic encapsulation layer over the inorganic encapsulation layer;
 a buffer layer over the organic encapsulation layer; and
 an interlayer over the buffer layer.

3. The display device of claim 2, wherein the concave portion is formed in the interlayer.

4. The display device of claim 2, wherein the concave portion is formed in the interlayer and the buffer layer to expose a surface of the organic encapsulation layer and the adhesive reinforcing portion is formed inside of the concave portion so that the adhesive reinforcing portion contacts the exposed surface of the organic encapsulation layer.

5. The display device of claim 2, wherein:
the concave portion penetrates the interlayer and the buffer layer and is formed in a part of the organic encapsulation layer, and
the adhesive reinforcing portion is formed inside of the concave portion so that the adhesive reinforcing portion contacts an inner surface of the organic encapsulation layer.

6. The display device of claim 2, further comprising a bank layer between the sub-pixels.

7. The display device of claim 6, wherein:
the concave portion is formed in the interlayer, the buffer layer, the organic encapsulation layer, and the inorganic encapsulation layer to expose a part of a surface of the bank layer, and
the adhesive reinforcing portion is formed inside of the concave portion so that the adhesive reinforcing portion contacts the exposed part of the surface of the bank layer.

8. The display device of claim 6, wherein:
the concave portion is formed in the interlayer, the buffer layer, the organic encapsulation layer, and the inorganic encapsulation layer and is formed in a part of the bank layer, and
the adhesive reinforcing portion is formed in the concave portion so that the adhesive reinforcing portion contacts an inner surface of the bank layer.

9. The display device of claim 2, wherein:
the inorganic encapsulation layer and the organic encapsulation layer are formed in an outer portion of the first substrate to encapsulate the thin film transistor and organic light emitting element on the first substrate, and
the inorganic encapsulation layer is disposed on the first substrate outside of the organic encapsulation layer.

10. The display device of claim 9, wherein:
a second concave portion is formed in the inorganic encapsulation layer on the outer portion of the first substrate, and
the passivation layer is extended to the outer portion of the first substrate to fill the second concave portion to form another adhesive reinforcing portion inside the second concave portion in the inorganic encapsulation layer.

11. The display device of claim 2, wherein:
a second concave portion is formed in the first substrate at an outer portion of the first substrate, and
the passivation layer is extended to the outer portion of the first substrate to fill the second concave portion to form another adhesive reinforcing portion inside of the second concave portion in the first substrate.

12. The display device of claim 2, further comprising:
a bridge on the buffer layer,
wherein the first touch electrode is directly on the interlayer and is connected electrically to the bridge through a contact hole formed in the interlayer,
wherein the second touch electrode is directly on the interlayer and is electrically insulated from the first touch electrode, and
wherein the first touch electrode, the second touch electrode, and the bridge constitute a touch sensor.

13. The display device of claim 12, wherein the concave portion and the adhesive reinforcing portion are formed in each region between the first touch electrode and the second touch electrode.

14. The display device of claim 1, wherein the concave portion is formed in a circular shape, an elliptical shape, or a polygonal shape.

15. The display device of claim 1, wherein the concave portion is formed of an undercut shape where an area of a lower portion is larger than an area of an entrance.

16. The display device of claim 1, wherein the first substrate is made of a glass or plastic based material.

17. The display device of claim 1, further comprising:
a bridge electrically connected to the first touch electrode,
wherein the insulating layer cover an upper surface of the bridge, and the bridge is connected to the first touch electrode through a contact hole in the insulating layer.

18. The display device of claim 17, wherein each of the first touch electrode, the second touch electrode, and the bridge directly contacts the insulating layer.

19. A display device, comprising:
a first substrate including a plurality of sub-pixels;
a thin film transistor in each sub-pixel of the first substrate;
an organic light emitting element in each sub-pixel of the first substrate;
an insulating layer over the thin film transistor and the organic light emitting element;
a touch sensor over the insulating layer;
a passivation layer covering the touch sensor; and
a second substrate disposed over the passivation layer,
wherein a plurality of concave portions are formed in the insulating layer, and a concave portion among the plurality of concave portions is filled with the passivation layer to form an adhesive reinforcing portion,
wherein the insulating layer includes:
an inorganic encapsulation layer;
an organic encapsulation layer over the inorganic encapsulation layer;
a buffer layer over the organic encapsulation layer; and
an interlayer over the buffer layer, and
wherein the concave portion is formed in the interlayer and the buffer layer to expose a surface of the organic encapsulation layer, and the adhesive reinforcing portion is formed inside of the concave portion so that the adhesive reinforcing portion contacts the exposed surface of the organic encapsulation layer.

20. A display device, comprising:
a first substrate including a plurality of sub-pixels;
a thin film transistor in each sub-pixel of the first substrate;
an organic light emitting element in each sub-pixel of the first substrate;
an insulating layer over the thin film transistor and the organic light emitting element;
a touch sensor over the insulating layer;
a passivation layer covering the touch sensor; and
a second substrate disposed over the passivation layer,
wherein a plurality of concave portions are formed in the insulating layer, and a concave portion among the plurality of concave portions is filled with the passivation layer to form an adhesive reinforcing portion, and
wherein the concave portion is formed of an undercut shape where an area of a lower portion is larger than an area of an entrance.

* * * * *